(12) United States Patent
Ahmed et al.

(10) Patent No.: US 7,307,570 B2
(45) Date of Patent: Dec. 11, 2007

(54) METHOD AND APPARATUS TO EMULATE A FILTER

(75) Inventors: Walid Khairy Mohamed Ahmed, Tinton Falls, NJ (US); Anthony Dennis, Belle Meade, NJ (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 11/185,953

(22) Filed: Jul. 20, 2005

(65) Prior Publication Data

US 2007/0018874 A1   Jan. 25, 2007

(51) Int. Cl.
*H03M 1/76* (2006.01)
(52) U.S. Cl. ........................ 341/148; 341/144
(58) Field of Classification Search ............... 332/104, 332/107, 123; 375/264, 278; 341/143, 144, 341/148
See application file for complete search history.

(56) References Cited

U.S. PATENT DOCUMENTS

| | | | |
|---|---|---|---|
| 5,012,245 A | 4/1991 | Scott et al. | |
| 5,369,606 A | 11/1994 | Hessel | |
| 5,379,242 A | 1/1995 | Rose et al. | |
| 5,524,286 A | 6/1996 | Chiesa et al. | 455/126 |
| 5,598,436 A | 1/1997 | Brajal et al. | 375/297 |
| 5,905,760 A | 5/1999 | Schnabl et al. | 375/296 |
| 6,043,707 A | 3/2000 | Budnik | 330/10 |
| 6,125,266 A | 9/2000 | Matero et al. | 455/126 |
| 6,147,553 A | 11/2000 | Kolanek | 330/10 |
| 6,320,912 B1* | 11/2001 | Baba | 375/264 |
| 6,449,465 B1 | 9/2002 | Gailus et al. | 455/126 |
| 6,531,973 B2* | 3/2003 | Brooks et al. | 341/143 |
| 6,621,340 B1 | 9/2003 | Perthold et al. | 330/149 |
| 6,646,581 B1* | 11/2003 | Huang | 341/143 |
| 6,834,084 B2 | 12/2004 | Hietala | 375/296 |
| 2002/0098812 A1 | 7/2002 | Sourour et el. | 455/91 |
| 2002/0186783 A1 | 12/2002 | Opas et al. | 375/297 |
| 2002/0193085 A1 | 12/2002 | Mathe et al. | 455/126 |
| 2003/0095608 A1 | 5/2003 | Duperray | 375/297 |
| 2003/0215025 A1 | 11/2003 | Hietala | 375/297 |
| 2003/0215026 A1 | 11/2003 | Hietala | 375/297 |
| 2003/0235253 A1 | 12/2003 | Dally | |
| 2004/0021517 A1 | 2/2004 | Irvine et al. | 330/151 |
| 2004/0047432 A1 | 3/2004 | Iwasaki | 375/297 |
| 2004/0179629 A1 | 9/2004 | Song et al. | |
| 2005/0007265 A1* | 1/2005 | Geraghty et al. | 341/141 |
| 2005/0017801 A1 | 1/2005 | Bachman, II et al. | 330/149 |
| 2005/0122164 A1 | 6/2005 | Brandt et al. | 330/10 |

FOREIGN PATENT DOCUMENTS

| | | |
|---|---|---|
| EP | 1 257 062 A2 | 11/2002 |
| GB | 2 219 158 A | 11/1989 |
| SU | 1679478 A1 | 9/1991 |

OTHER PUBLICATIONS

Kim Myung-Soon et al: "Look-up table based pulse-shaping filter design" Electronics Letters, IEE Stevenage, GB, vol. 36, No. 17, Aug. 17, 2000 (Aug. 17, 2000), pp. 1505-1506, XP006015586 ISSN: 0013-5194.

\* cited by examiner

*Primary Examiner*—Brian Young

(57) ABSTRACT

A system, apparatus, method and article to emulate a filter are described. The apparatus may include a digital-to-analog converter having an impulse response emulator, the impulse response emulator to receive multiple digital signals each having a predetermined waveform, and convert a sequence of bits from each digital signal to a predetermined analog waveform corresponding to the sequence of bits. Other embodiments are described and claimed.

19 Claims, 9 Drawing Sheets

Filter Input

Filter Output

METHOD AND APPARATUS TO EMULATE A FILTER

CROSS-REFERENCE TO RELATED APPLICATION

This application relates to U.S. patent application Ser. No. 11/185,514 titled "Method And Apparatus To Emulate A Filter Using Digital Elements" filed Jul. 20, 2005 and having inventors Walid Khairy Mohamed Ahmed and Anthony Dennis, the entirety of which is incorporated herein for all purposes.

BACKGROUND

Electronic devices may need to convert information between an analog domain and a digital domain. For example, a wireless device may use an analog-to-digital converter (ADC) to convert analog voice information to digital signals for communication over a digital wireless system. Similarly, a wireless device may use a digital-to-analog converter (DAC) to convert digital signals to analog signals prior to reproducing the information for a listener. DAC devices may sometimes use a filter to remove noise from a signal. The noise may originate from a number of sources, such as imperfections in the transmission system, manufacturing defects, signal processing errors, and so forth. Some filters, however, may be expensive to implement in terms of power, size and cost. Consequently, improvements in filtering techniques may improve the performance of a circuit, device or system.

SUMMARY

One exemplary embodiment may include an apparatus comprising a digital-to-analog converter having an impulse response emulator. The impulse response emulator may receive multiple digital signals each having a predetermined waveform. The impulse response emulator may convert a sequence of bits from each digital signal to a predetermined analog waveform corresponding to the sequence of bits. Other embodiments are described and claimed.

DETAILED DESCRIPTION

Figure 1:
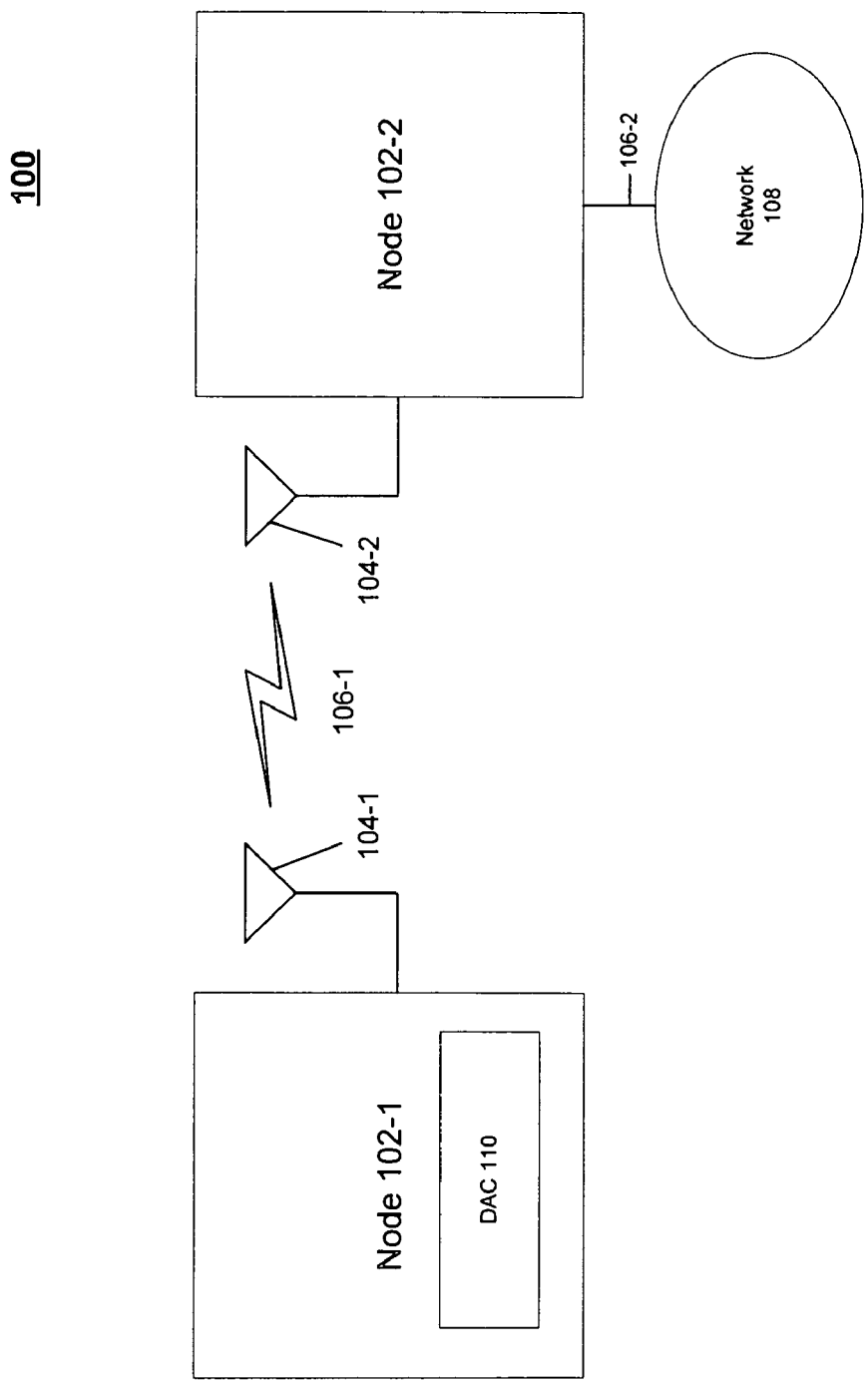
FIG. 1 illustrates an exemplary block diagram of a communication system in accordance with one embodiment.

FIG. 1 illustrates an exemplary block diagram of a communication system in accordance with one embodiment. FIG. 1 illustrates a block diagram of a communication system 100. Communication system 100 may have multiple nodes. A node may comprise any physical or logical entity having a unique address in system 100. Examples of a node may include, but are not necessarily limited to, a computer, server, workstation, notebook computer, handheld computer, telephone, cellular telephone, personal digital assistant (PDA), combination cellular telephone and PDA, and so forth. The unique address may comprise, for example, a network address such as an Internet Protocol (IP) address, a device address such as a Media Access Control (MAC) address, a telephone number, a personal identification number (PIN), and so forth.

The nodes of system 100 may be arranged to communicate different types of information, such as media information and control information. Media information is used herein in a very general sense and may refer to any data representing content meant for a user, such as voice information, video information, audio information, text information, numerical information, alphanumeric symbols, graphics, images, symbols, and so forth. Control information is also used herein in a very general sense and may refer to any data representing commands, instructions or control words meant for an automated system. For example, control information may be used to route media information through a system, or instruct a node to process the media information in a certain manner.

The nodes of system 100 may communicate media and control information in accordance with one or more protocols. A protocol may comprise a set of predefined rules or instructions to control how the nodes communicate information between each other. The protocol may be defined by one or more protocol standards as promulgated by a standards organization, such as the Internet Engineering Task Force (IETF), International Telecommunications Union (ITU), the Institute of Electrical and Electronics Engineers (IEEE), and so forth.

System 100 may be implemented as a wired communication system, a wireless communication system, or a combination of both. Although system 100 may be illustrated using a particular communications media by way of example, it may be appreciated that the principles and techniques discussed herein may be implemented using any type of communication media and accompanying technology.

In one embodiment, system 100 may be implemented as a wireless system. For example, system 100 may include one or more wireless nodes arranged to communicate information over one or more types of wireless communication media, sometimes referred to herein as wireless shared media. An example of a wireless communication media may include portions of a wireless spectrum, such as the RF spectrum. The wireless nodes may include components and interfaces suitable for communicating information signals over the designated wireless spectrum, such as one or more antennas, wireless transmitters/receivers ("transceivers") or radios, amplifiers, filters, control logic, and so forth.

Referring again to FIG. 1, system 100 may include one or more nodes 102-1-p. Although FIG. 1 is shown with a limited number of nodes in a certain topology, it may be appreciated that system 100 may include more or less nodes in any type of topology as desired for a given implementation.

In one embodiment, system 100 may include a node 102-1. Node 102-1 may comprise, for example, a fixed or mobile device having wireless capabilities. Examples for node 102-1 may include a computer, server, workstation, notebook computer, handheld computer, telephone, cellular telephone, personal digital assistant (PDA), combination cellular telephone and PDA, and so forth. In one embodiment, for example, node 102-1 may comprise a mobile device such as a cellular telephone. For example, node 102-1 may comprise a cellular telephone operating in accordance with a polar architecture, such as described in United States Patent Application 2004/0109572 A1 titled "Apparatus, Methods and Articles of Manufacture For Noise Reduction In Electromagnetic Signal Processing," filed on Dec. 2, 2002 and published on Jun. 10, 2004, the entirety of which is hereby incorporated by reference for all purposes. Although some embodiments may be described with mobile device 102-1 implemented as a cellular telephone by way of example, and a polar architecture in particular, it may be appreciated that other embodiments may be implemented using other wireless devices and other architectures as well. The embodiments are not limited in this context.

In one embodiment, system 100 may include a node 102-2. Node 102-2 may comprise, for example, a fixed station having wireless capabilities. Examples for node 102-2 may include a wireless access point (AP), base station or node B, router, switch, hub, gateway, and so forth. In one embodiment, for example, node 102-2 may comprise a base station or node B for a cellular telephone. Although some embodiments may be described with node 102-2 implemented as a base station or node B by way of example, it may be appreciated that other embodiments may be implemented using other wireless devices as well.

In one embodiment, mobile device 102-1 and fixed station 102-2 may comprise part of a cellular communication system. Examples of cellular communication systems may include Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) cellular radiotelephone systems, Extended-TDMA (E-TDMA) cellular radiotelephone systems, third generation (3G) systems such as Wide-band CDMA (WCDMA), CDMA-2000, Universal Mobile Telephone System (UMTS) cellular radiotelephone systems compliant with the Third-Generation Partnership Project (3GPP), and so forth. Communications between mobile device 102-1 and fixed station 102-2 may be performed over wireless communication medium 106-1 in accordance with a number of wireless protocols suitable for a given type of cellular system.

In addition to voice communication services, mobile device 102-1 and fixed station 102-2 may communicate using a number of different data communication services. Examples of cellular data communication systems offering data communication services may include GSM/GPSR systems, CDMA/1xRTT systems, Enhanced Data GSM Environment (EDGE) systems, and so forth.

In one embodiment, system 100 may include a network 108 connected to node 102-2 by a wired communications medium 106-2. Examples for wired communications medium 106-2 may include a wire, cable, printed circuit board (PCB), backplane, switch fabric, semiconductor material, twisted-pair wire, co-axial cable, fiber optics, and so forth. Network 108 may comprise part of the same cellular system as mobile device 102-1 and fixed station 102-2, and may further include additional cellular system nodes such as mobile stations, base stations, radio network controllers (RNC), mobile services switching centers (MSC), and so forth. In addition, network 108 may comprise additional nodes and connections to other networks, including a voice/data network such as the Public Switched Telephone Network (PSTN), a packet network such as the Internet, a local area network (LAN), a metropolitan area network (MAN), a wide area network (WAN), enterprise networks, private networks, and so forth.

In one embodiment, cellular telephone 102-1 may include a DAC 110. DAC 110 may convert information between a digital domain and an analog domain. For example, an ADC (not shown) may be used to convert analog voice information to digital signals for communication over a digital wireless system. The ADC may be implemented anywhere in system 100, including cellular telephone 102-1. DAC 110 may be used to convert digital signals to analog signals. For example, cellular telephone 102-1 may use DAC 110 to convert digital signals received from based station 102-2 to analog voice information prior to reproducing the voice information for a listener.

When implementing a DAC, there may be a need to use one or more filtering techniques to remove noise from a signal. The noise may originate from a number of sources, such as imperfections in the transmission system, manufacturing defects, signal processing errors, and so forth. The use of conventional filters, however, may be undesirable for a number of reasons. For example, some cellular architectures may use an anti-alias filter. Anti-aliasing filters are typically implemented using high-order analog filter architectures that may require bulky and expensive capacitive and inductive elements. Such bulky capacitors and inductors may also be problematic when attempting to integrate a system on an Integrated Circuit (IC) chip. For example, the required inductor or capacitor specifications may result in sizes that are too large to be integrated on an IC, or may require fabrication material or techniques that are difficult to integrate with the fabrication technology implemented for other parts of the system. Furthermore, conventional architectures typically implement the anti-alias filter after the DAC. The anti-alias filter components may dissipate some of the output power of the DAC thereby decreasing power efficiency of the system. Such a scenario can arise when using, for example, binary (digital) segmented RF signal power amplifiers (PA), where the PA segments are $2^i$ weighted in terms of their equivalent RF amplification gain. In this scenario the PA may operate as both the DAC and the PA. Therefore, it may be undesirable to follow the PA with circuit elements that may waste output power delivered to the transmit antenna.

Some embodiments solve these and other problems. Some embodiments may use a novel technique to implement a filter with a DAC. In one embodiment, for example, the filter may be integrated with DAC 110, although the embodiments are not necessarily limited in this context. DAC 110 may filter individual digital bit streams using an impulse response emulation technique. DAC 110 may complete conversion operations on the filtered bit streams by performing $2^i$ weighted-sum operations on the filtered outputs, for example. DAC 110 may be described in more detail with reference to FIG. 2.

Figure 2:
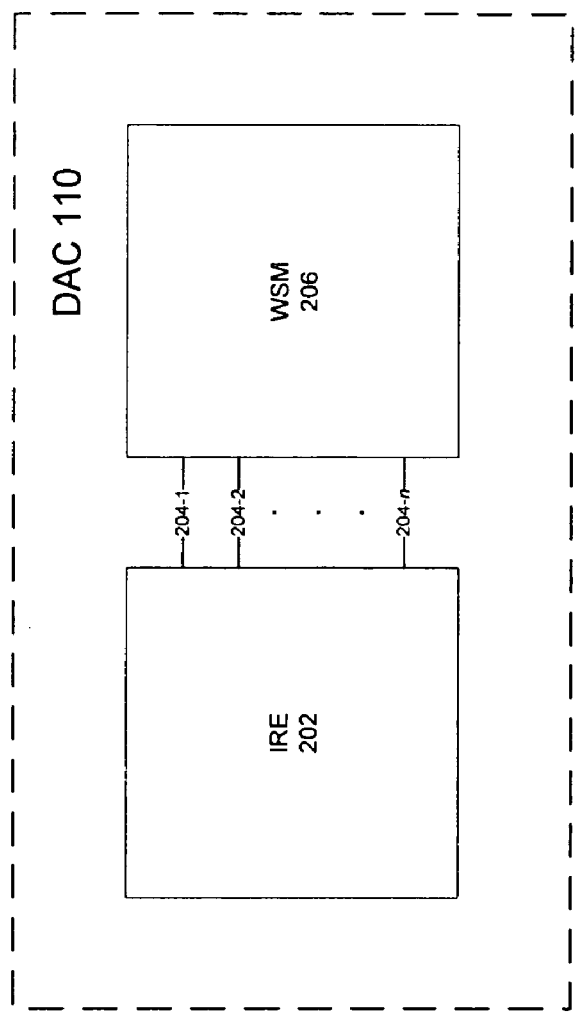
FIG. 2 illustrates an exemplary block diagram of a digital-to-analog converter in accordance with one embodiment.

FIG. 2 illustrates an exemplary block diagram of a DAC in accordance with one embodiment. FIG. 2 illustrates a block diagram of one possible implementation of DAC 110 suitable for use with one or more nodes 102-1-p of system 100, such as node 102-1, for example. The embodiments are not limited, however, to the example given in FIG. 2.

As shown in FIG. 2, DAC 110 may comprise multiple elements, such as elements 202, 204 and 206. These elements may be implemented using one or more circuits, components, registers, processors, software subroutines, modules, or any combination thereof, as desired for a given set of design or performance constraints. Although FIG. 2 shows a limited number of elements by way of example, it can be appreciated that more or less elements may be used in DAC 110 as desired for a given implementation.

In one embodiment, DAC 110 may be arranged to perform DAC operations for a given node or device. Operations to convert or decode a digital signal into its equivalent analog signal typically include at least three stages. The first stage may comprise detecting the presence of the digital pulses. This detection may be performed by examining the digital signal at specific instants of time to determine whether a fixed threshold is exceeded or not. If the digital signal exceeds the threshold at the examining instant, then it is decided that a digital pulse corresponding to a binary 1 may be present, otherwise a 0 may be present. The second stage may comprise decoding the binary data into an analog signal. The analog signal may comprise a series of pulses with amplitudes equal to the decoded binary value and a time width equal to the sampling interval. The third stage may comprise smoothing the analog signal using a filter, such as a low-pass filter or anti-aliasing filter with a given width.

Some embodiments may use a novel technique to integrate a filter with DAC 110. DAC 110 may be arranged to filter individual digital signals using an impulse response emulation technique. In one embodiment, for example, DAC 110 may include an impulse response emulator (IRE). IRE 202 may receive multiple digital signals each having a predetermined waveform. In one embodiment, for example, the multiple digital signals may comprise binary digital signals, although the embodiments are not limited in this context. A binary digital signal may comprise a digital signal that represents one of two discrete values, such as a "1" and a "0". The predetermined waveform may comprise any type of waveform that has known characteristics, such as a basic or fundamental shape. One example of a predetermined waveform may comprise a square pulse, although the embodiments are not limited in this context. In one embodiment, for example, the predetermined waveform may comprise a predetermined periodic waveform, although the embodiments are not limited in this context. A periodic waveform may have a basic or fundamental shape that repeats over time. Examples of periodic waveforms may include a square wave, a triangular wave, a sawtooth wave, and so forth. The embodiments are not limited to a particular type of digital signal or predetermined waveform, as long as the characteristics of the digital signal and predetermined waveform are known in advance. The embodiments are not limited in this context.

In one embodiment, for example, IRE 202 may receive multiple digital signals each having a square wave periodic waveform. Although one embodiment may use a square waveform by way of example, it may be appreciated that IRE 202 may be modified for use with any type of periodic waveform as desired for a given set of design constraints. The embodiments are not limited in this context.

In one embodiment, for example, IRE 202 may convert a sequence of bits from each digital signal to a predetermined analog waveform corresponding to the sequence of bits. The predetermined analog waveform may represent a predetermined impulse response for a filter based on the periodic waveform.

In one embodiment, DAC 110 may include a weighted-sum module (WSM) 206. WSM 206 may perform any remaining DAC operations on the resulting individual waveforms or bit streams received from IRE 202 via lines 204-1-n, where n represents a number of bit streams for a given implementation. For example, WSM 206 may perform the appropriate $2^i$ weighted-sum operation on the filtered outputs.

In one embodiment, the impulse response emulation technique implemented using IRE 202 and WSM 206 may exploit the periodic nature of the input bit streams. This characteristic may be described in more detail with reference to FIG. 3.

Figure 3:
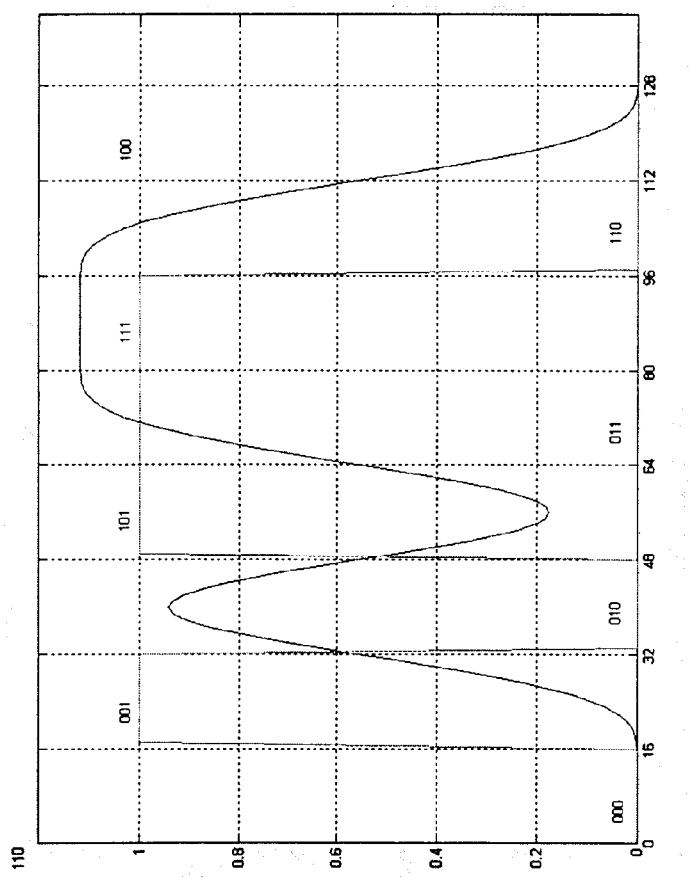
FIG. 3 illustrates a graph of various filter responses in accordance with one embodiment.

FIG. 3 illustrates a graph of various filter responses in accordance with one embodiment. FIG. 3 illustrates a graph 300. Graph 300 may illustrate a set of filter responses to various combinations of input bit sequences. For example, assume IRE 202 receives a periodic signal in the form of a square wave. When a stream of square pulses, each with duration $T_b$, excites a linear filter, the response of the filter during the $k^{th}$ bit duration can be calculated as a function of the impulse response of the filter and the values of the $(k-L)^{th}$ to the $k^{th}$ bits, where L is the duration of the impulse response of the filter expressed in number of $T_b$ intervals. That is, the impulse-response duration of the filter is $LT_b$.

FIG. 3 illustrates an example of a filter response to square-pulse excitations for a filter with an impulse-response duration L=2, thereby resulting in $2^{(L+1)}$ waveforms. The bit-excitation or bit-history that resulted in the corresponding $T_b$-long waveform is also shown. The square graph shows the sequence of input bits versus time. The curved graph shows the corresponding filter response to the input bits versus time. The eight different bit annotations "000", "001", . . . , "111" explicitly indicate the combination of the current bit and last two bits that result in the corresponding filter response.

Based on the information provide by graph 300, it may be possible to mimic or emulate a response for a filter to a given stream of square-pulses. This may be accomplished by monitoring the last L+1 bits, and generating a corresponding analog waveform that emulates the response based on predetermined knowledge of the impulse response of the filter. The impulse response for a filter to a given stream of square pulses may be derived using the convolution of the impulse response of the filter with the input sequence of square pulses. An example of the possible range of predetermined impulse responses for a given filter size may be described in more detail with reference to FIGS. 4A–D.

Figure 4A:
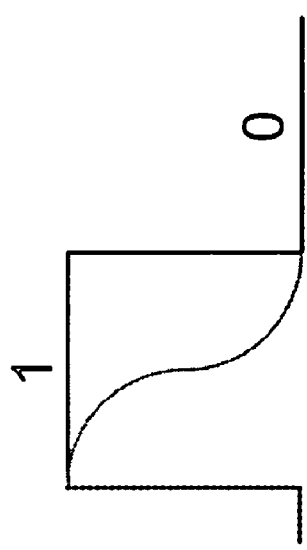
FIGS. 4A–D illustrates four graphs of various filter responses in accordance with one embodiment.
Figure 4B:
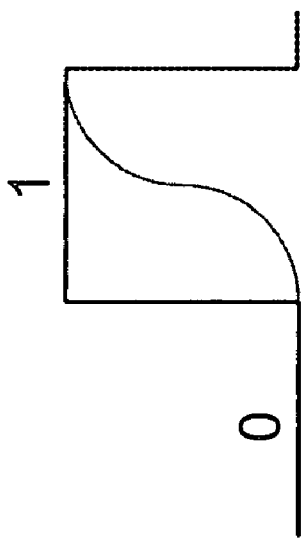
Figure 4C:
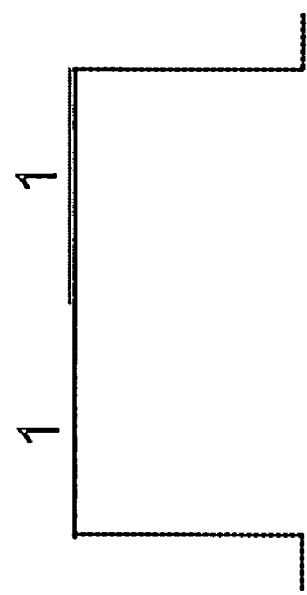
Figure 4D:

FIGS. 4A–D illustrates four graphs of various filter responses in accordance with one embodiment. Consider a case where L=1 and filter memory is equal to 2, thereby indicating that the impulse response for a filter uses only the current bit and preceding bit. Four possible responses of the filter to the bit sequence may be determined in this example (e.g., $2^{(L+1)}=2^{(1+1)}=4$). FIGS. 4A–D may illustrate each of the four possible filter output transitions. FIG. 4A illustrates the case where a binary digital signal transitions from a current bit value of 0 to a next bit value of 1. FIG. 4B illustrates the case where a binary digital signal transitions from a current bit value of 0 to a next bit value of 0. FIG. 4C illustrates the case where a binary digital signal transitions from a current bit value of 1 to a next bit value of 0. FIG. 4D illustrates the case where a binary digital signal transitions from a current bit value of 1 to a next bit value of 1.

Some embodiments may exploit the known characteristics of a digital signal to determine in advance the filter responses to a sequence of bits within the signal. As shown in FIGS. 4A–D, for the case where L=1 there are only four possible impulse responses to output from the filter. IRE 202 and WSM 206 may be arranged to generate all the possible impulse responses for a given filter configuration, and select the appropriate predetermined filter response to produce a filtered waveform corresponding to a given sequence of bits represented by the digital signal. Example implementations for IRE 202 and WSM 206 of DAC 110 may be described in more detail with reference to FIGS. 5–9.

Figure 5:
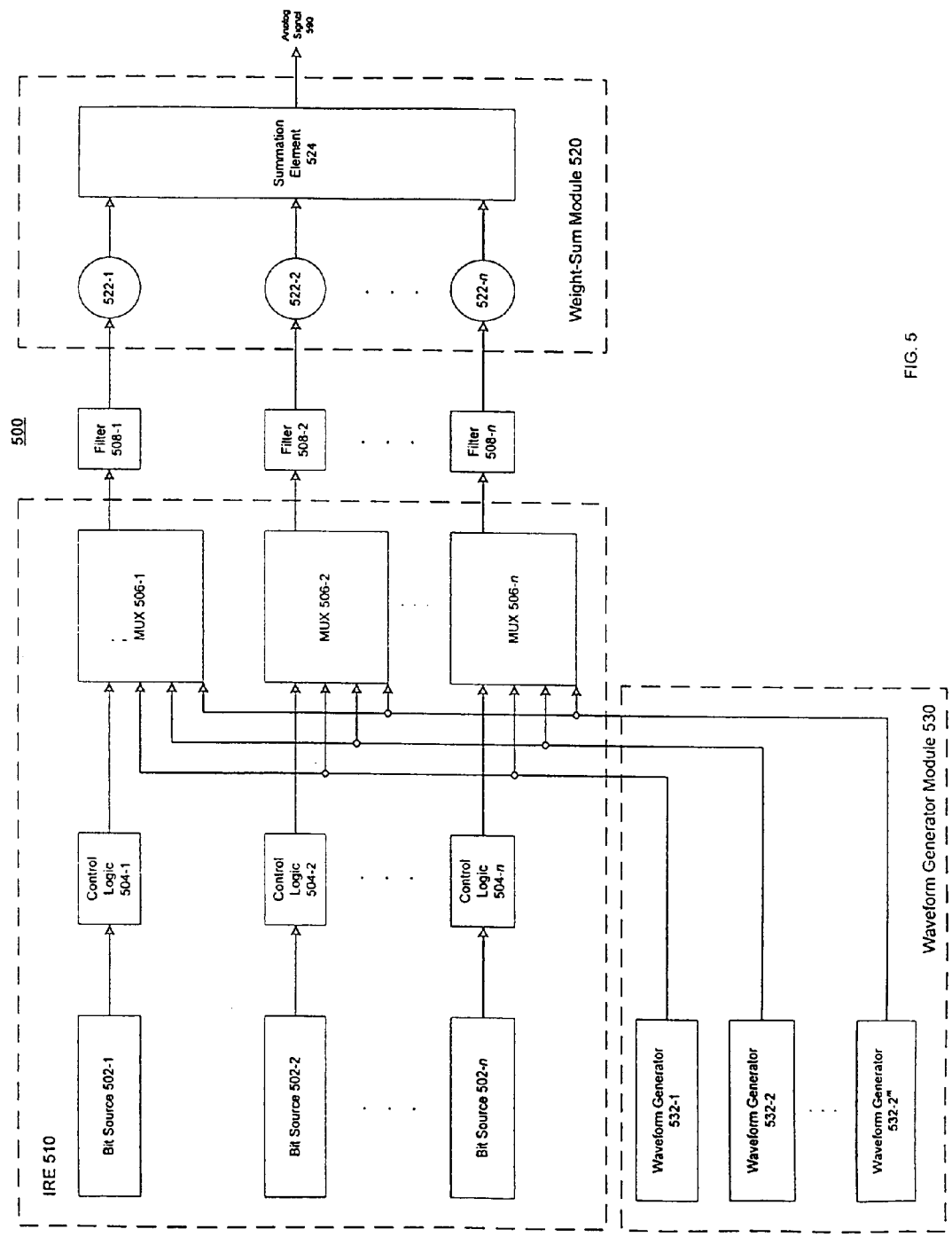
FIG. 5 illustrates an exemplary block diagram for a first implementation of a digital-to-analog converter in accordance with one embodiment.

FIG. 5 illustrates an exemplary block diagram for a first implementation of a DAC in accordance with one embodiment. FIG. 5 illustrates a block diagram of a DAC 500. DAC 500 may comprise a more detailed implementation of DAC 110, for example, as described with reference to FIG. 2. The embodiments are not limited, however, to the example implementation described with reference to DAC 500.

As shown in FIG. 5, DAC 500 may comprise multiple elements, such as elements 510, 520 and 530. These elements, or the sub-elements included therein, may be implemented as one or more circuits, components, registers, processors, software subroutines, modules, or any combination thereof, as desired for a given set of design or performance constraints. Although FIG. 5 shows a limited number of elements by way of example, it can be appreciated that more or less elements may be used in DAC 500 as desired for a given implementation.

In one embodiment, DAC 500 may include an IRE 510. IRE 510 may comprise a more detailed implementation of IRE 202, for example, as described with reference to FIG. 2. The embodiments are not limited, however, to the example implementation described with reference to IRE 510.

In one embodiment, IRE 510 may include a bit path for each received digital signal, with each bit path to include a control logic and a multiplexer. For example, a first bit path may comprise bit source 502-1, control logic 504-1 and multiplexer 506-1. In another example, a second bit path may comprise bit source 502-2, control logic 504-2 and multiplexer 506-2. In yet another example, a $n^{th}$ bit path may comprise bit source 502-n, control logic 504-n and multiplexer 506-n, with n representing a number of digital signals implemented for a given set of design constraints. For example, if DAC 500 is arranged to process 1 bit/second, and the sampling rate is 5 times the bit rate, then IRE 510 may receive 5 samples/second (n=5). The embodiments are not limited in this context.

In one embodiment, bit source 502-1-n may represent a source of bits from a given digital signal. In one embodiment, for example, bit source 502-1-n may perform the first stage of converting or decoding a digital signal into its equivalent analog signal by detecting the presence of the digital pulses. Bit source 502-1-n may examine the received digital signal at specific instants of time to determine whether a fixed threshold is exceeded or not. If the digital signal exceeds the threshold at the examining instant, then bit source 502-1-n may determine that a digital pulse corresponding to a binary 1 may be present. If the digital signal fails to exceed the threshold at the examining instant, then bit source 502-1-n may determine that a digital pulse corresponding to a binary 0 may be present. It may be appreciated that the logic may be reversed and still fall within the scope of the embodiments. It may also be appreciated that the bit detection may be performed prior to reaching DAC 500, and therefore bit source 502-1-n may be omitted. Bit source 502-1-n may output the binary values to a corresponding control logic 504-1-n.

In one embodiment, control logic 504-1-n may receive a sequence of bits from a corresponding digital signal, and output a control word using the sequence of bits. The control word may control which analog waveform is selected from among a number of different analog waveforms received by a corresponding multiplexer 506-1-n. It is worthy to note that although FIG. 5 illustrates only a single representative control line between each of control logic 504-1-n and a corresponding multiplexer 506-1-n, it may be appreciated that multiple control lines may be used to communicate the control word between control logic 504-1-n and a corresponding multiplexer 506-1-n. In one embodiment, for example, m control lines may be used, where m=L+1 and L is the impulse response duration for a filter in number of bits. Each control line may be used to convey a corresponding bit of the control word.

In one embodiment, DAC 500 may include waveform generating module 530. Waveform generator module 530 may comprise multiple waveform generators $532\text{-}1\text{-}2^{m}$. Each waveform generator $532\text{-}1\text{-}2^{m}$ may be coupled to all of multiplexers 506-1-n. Each of waveform generators $532\text{-}1\text{-}2^{m}$ may be arranged to generate a particular type of analog waveform repeatedly over a periodic interval, with each waveform generator $532\text{-}1\text{-}2^{m}$ generating a different analog waveform relative to the other waveform generators $532\text{-}1\text{-}2^{m}$. Each analog waveform may correspond to a predetermined impulse response for a filter corresponding to a filter size as represented by the code word generated by a given control logic 504-1-n. At a predetermined time interval (e.g., every clock cycle), waveform generators $532\text{-}1\text{-}2^{m}$ may output their respective analog waveforms to multiplexers 506-1-n.

In one embodiment, each multiplexer 506-1-n may receive the different analog waveforms in parallel from waveform generators $532\text{-}1\text{-}2^{m}$. Each multiplexer 506-1-n may also receive a control word from a corresponding control logic 504-1-n. Each multiplexer 506-1-n may use the control word to select a predetermined analog waveform from among the different analog waveforms, and output the selected predetermined analog waveform. In other words, each multiplexer 506-1-n may operate as a switch that passes through a given input from waveform generators $532\text{-}1\text{-}2^{m}$ that is equal to the value represented by the control word. The inputs from waveform generators $532\text{-}1\text{-}2^{m}$ as received by multiplexers 506-1-n may be continuous wave in general (e.g., analog signals). No restrictions on the nature of the input waveforms are necessarily assumed.

In one embodiment, a filter 508-1-n may be implemented for each bit path of IRE 510. Filters 508-1-n may provide some additional filtering of the predetermined analog waveform received from a corresponding multiplexer 506-1-n. For example, if the predetermined analog waveform represented a certain percentage of the total filtering needed for a digital signal (e.g., 90%), then filters 508-1-n may provide the remaining amount of filtering needed for the digital signal (e.g., 10%). It may be appreciated, however, that the predetermined analog waveforms may represent a total amount of filtering needed for a given digital signal (e.g., 100%), and therefore filters 508-1-n may be omitted. Filters 508-1-n may each output a filtered analog waveform corresponding to the incoming digital signal.

It is worthy to note that other filters may be implemented in various parts of DAC 500 as well. For example, a filter (not shown) may be coupled to each waveform generator $532\text{-}1\text{-}2^{m}$ to clean up or provide some nominal filtering for each analog waveform prior to delivering the filtered analog waveform to multiplexers 506-1-n. The type and number of additional filters implemented with DAC 500 may vary in accordance with a given set of design constraints, and the embodiments are not limited in this context.

In one embodiment, DAC 500 may include a WSM 520. WSM 520 may comprise a more detailed implementation of WSM 206, for example, as described with reference to FIG. 2. The embodiments are not limited, however, to the example implementation described with reference to WSM 520.

In one embodiment, WSM 520 may complete conversion operations on the filtered bit streams using the appropriate DAC technique, such as by performing $2^i$ weighted-sum operations on the filtered outputs, where i equals 0, . . . , n−1, for example. In one embodiment, for example, WSM 520 may comprise a weighting element 522-1-n for each bit path and a summation element 524. Each weighting element 522-1-n may weight the received analog waveform and output a weighted analog waveform. Summation element 524 may receive the weighted analog waveforms from each weighting element 522-1-n and sum the weighted analog waveforms to form an analog output signal 590.

Figure 6:
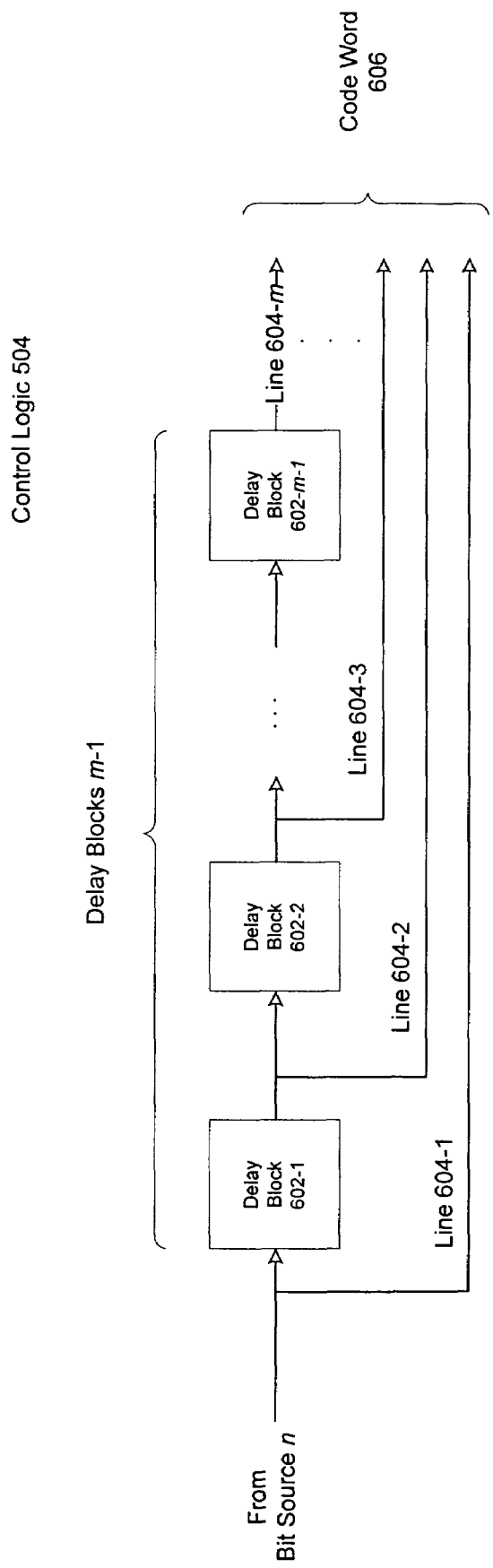
FIG. 6 illustrates an exemplary block diagram of a control logic for the first digital-to-analog converter in accordance with one embodiment.

FIG. 6 illustrates an exemplary block diagram of a control logic for the first DAC in accordance with one embodiment. FIG. 6 illustrates a block diagram of a control logic 504 for DAC 500. Control logic 504 may be representative of any of control logics 504-1-n as described with reference to FIG. 5. The embodiments are not limited, however, to the example described with reference to control logic 504.

In one embodiment, control logic 504 may receive a sequence of bits from a corresponding digital signal, and output a control word using the sequence of bits. For example, control logic 504 may receive a sequence of binary values from a corresponding bit source 502. Control logic 504 may have sufficient memory resources to store a certain number of bits based on a determined filter size for a given implementation. The memory resources may comprise any suitable type of memory resources, such as a buffer, shift register, and so forth. In one embodiment, for example, the memory resource may comprise an m-bit shift register.

In one embodiment, control logic 504 may output a control word 606 corresponding to the bits stored in the memory resource. This may be accomplished by delaying output of a certain number of bits by a certain time period so that control word 606 is received by a corresponding multiplexer 506-1-n at the same time interval (e.g., clock cycle). In one embodiment, for example, control logic 504 may store binary values using delay blocks m−1 as the binary values are received from a bit source n. The number of delay blocks may vary in accordance with the duration of the impulse response of the filter expressed in number of $T_b$ intervals (e.g., L). For example, if L=2 then control logic 504 may need a total of 2 delay blocks 602-1 and 602-2 (e.g., m−1=(L+1)−1=(2+1)−1=2). Each of delay blocks 602-1 and 602-2 may be used to delay two previously received binary values, and output the two previous binary values over control lines 604-2 and 604-3, respectively. A current binary value may be communicated over control line 604-1. As a result, control logic 504 may output control word 606 via control lines 604-1-3, with control word 606 comprising a current binary value and the preceding two binary values at any given time interval. Control word 606 may be passed over m control lines, with each control line to convey a corresponding binary value of control word 606.

In one embodiment, DAC 500 may comprise an example of a parallel waveform architecture or implementation of DAC 10 as described with reference to FIGS. 5 and 6. In one embodiment, it may also be possible to implement a serial waveform architecture as described with reference to FIGS. 7 and 8. The design considerations between the parallel waveform architecture and the serial waveform architecture may include the number of required wave-form generators in the parallel architecture versus the number of delay lines in the serial architecture. The serial waveform architecture may also have need of an additional counter, as described in more detail with reference to FIGS. 7 and 8.

Figure 7:
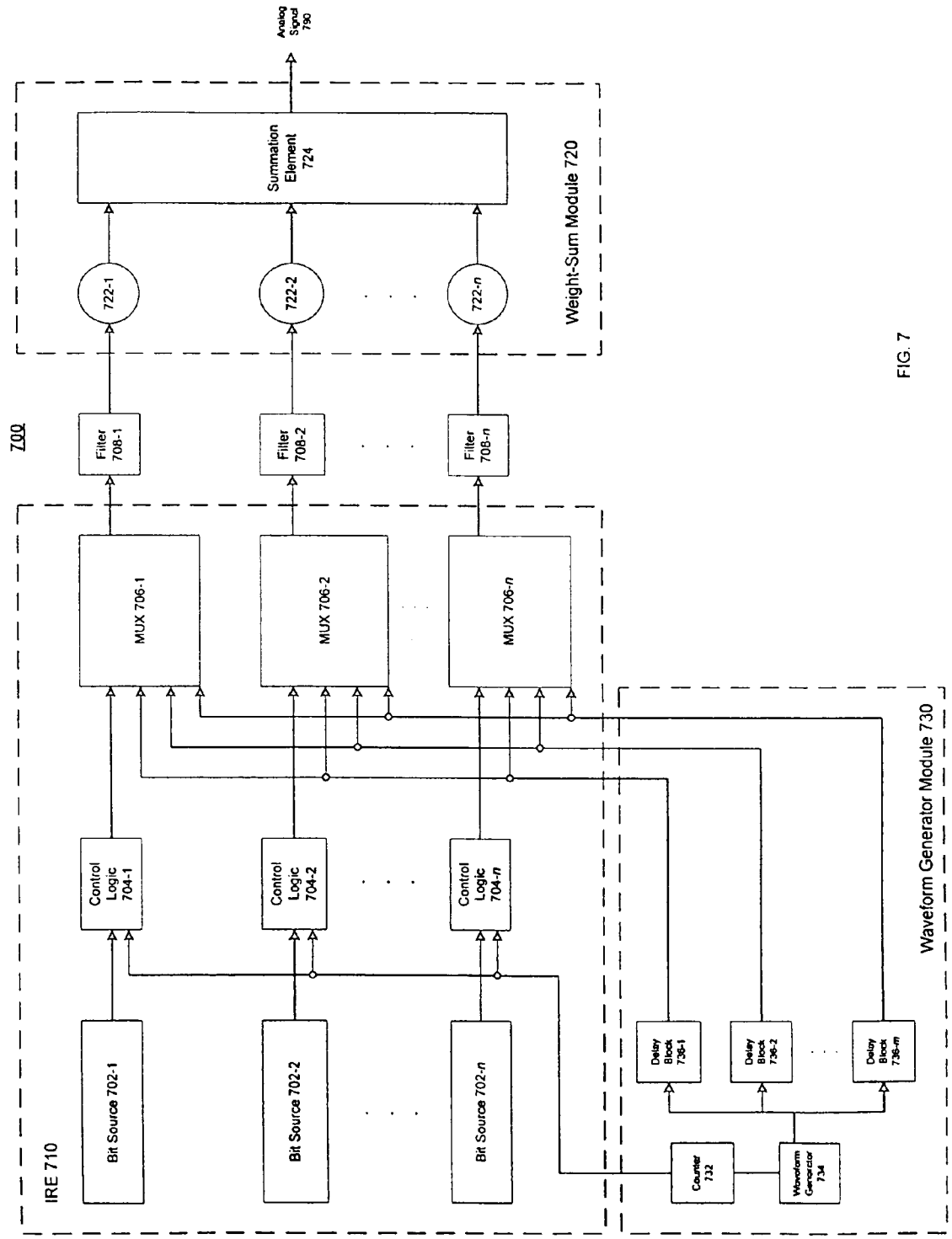
FIG. 7 illustrates an exemplary block diagram for a second implementation of a digital-to-analog converter in accordance with one embodiment.

FIG. 7 illustrates an exemplary block diagram for a second implementation of a DAC in accordance with one embodiment. FIG. 7 illustrates a block diagram of a DAC 700. DAC 700 may comprise a more detailed implementation of DAC 10, for example, as described with reference to FIG. 2. The embodiments are not limited, however, to the example implementation described with reference to DAC 700.

As shown in FIG. 7, DAC 700 may comprise multiple elements, such as elements 710, 720 and 730. These elements, or the sub-elements included therein, may be implemented as one or more circuits, components, registers, processors, software subroutines, modules, or any combination thereof, as desired for a given set of design or performance constraints. Although FIG. 7 shows a limited number of elements by way of example, it can be appreciated that more or less elements may be used in DAC 700 as desired for a given implementation.

In one embodiment, DAC 700 may be similar in structure and operation to DAC 500. For example, IRE 710 and 720 may be similar to IRE 510 and 520, respectively. Waveform generator module 730, however, may be modified with respect to waveform generator module 530 as described with reference to FIG. 5. Furthermore, control logic 704-1-n of IRE 710 may also be modified to generate a control word using counter signals received from waveform generator module 730.

In one embodiment, waveform generator module 730 may include a counter 732, a waveform generator 734, and multiple delay blocks 736. Waveform generator 734 may generate analog waveforms similar to waveform generators 532-1-2$^m$. Waveform generator 734, however, continuously generates a certain number of different analog waveforms over time in sequence, rather than each waveform generator 532-1-2$^m$ continuously generating the same analog waveform over time as with DAC 500.

Since waveform generator 734 continuously generates a sequence of different analog waveforms over time, DAC 700 may use a different timing technique to switch the appropriate analog waveform from IRE 710 to WSM 720 relative to DAC 500. For example, DAC 700 may include counter 732. Counter 732 may couple to each control logic and output a count signal representing a count value. Although a single line is shown between counter 732 and each control logic 704-1-n to reduce complexity, it may be appreciated that m lines may be used to communicate the appropriate count value. Each control logic 704-1-n may use the received count value to generate a control word for its corresponding multiplexer 706-1-n.

In one embodiment, for example, counter 732 may operate as a timing indicator to control when the appropriate waveform from the multiple waveforms received by a multiplexer 706 is passed through multiplexer 706 at the proper bit-interval. Counter 732 may continuously generate a count signal representing a count value, with each count value corresponding to one of the different analog waveforms. For example, in the case of L=2, there may comprise eight possible analog waveforms (e.g., $2^m=2^{(L+1)}=2^3=8$).

Counter 732 may continuously generate a count signal representing count values 1–8 (or 0–7). Counter 732 may output the count value to control logic 704-1-$n$ over m lines.

In one embodiment, waveform generator module 730 may also include a number of delay blocks 736-1 through 736-$2^m$. As waveform generator 734 generates its sequence of different analog waveforms, each waveform may be received by each of delay blocks 736-1 through 736-$2^m$. Each delay block may delay the received waveform by an increasing amount between Ts for delay block 736-1 to $(2^m-1)*$Ts for delay block 736-$2^m$. Consequently, delay blocks 736-1 through 736-$2^m$ may delay when a certain predetermined waveform is received by each multiplexer 706-1-n, and also which input line to multiplexers 706-1-n is carrying the particular waveform. Control logic 704 may use the count value from counter 732 to determine which input line to multiplexer 706 to select at a given time interval to receive a given waveform. Control logic 704 may be described in more detail with reference to FIG. 8.

Figure 8:
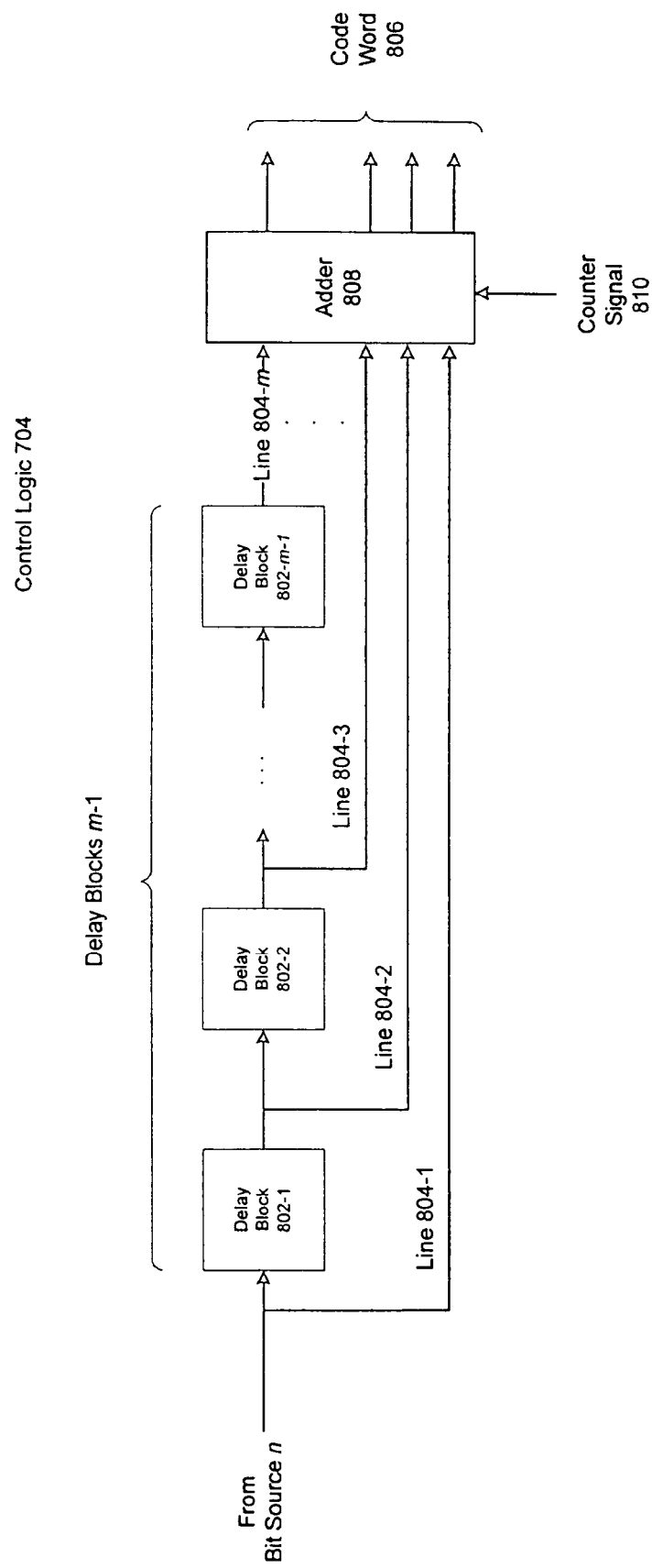
FIG. 8 illustrates an exemplary block diagram of a control logic for the second digital-to-analog converter in accordance with one embodiment.

FIG. 8 illustrates an exemplary block diagram of a control logic for the second DAC in accordance with one embodiment. FIG. 8 illustrates a block diagram of a control logic 704. Control logic 704 may be representative of any of control logics 704-1-n as described with reference to FIG. 7. The embodiments are not limited, however, to the example described with reference to FIG. 8.

In one embodiment, control logic 704 may be similar in structure and operation as control logic 504 as described with reference to FIG. 6. Control logic 704, however, may be modified to generate a code word using signals received from both bit source n and a counter signal 810. Counter signal 810 may comprise a counter signal from counter 732 of waveform generator module 730.

In one embodiment, control logic 704 may include delay blocks 802-1 through 802-m−1, control lines 804-1-m, and an adder 808. Delay blocks 802-1 through 802-m−1 and control lines 804-1-m operate similar to corresponding delay blocks 602-1 through 602-m−1 and control lines 604-1-m as described with reference to FIG. 6. Since waveform generator 734 continuously generates a certain number of different analog waveforms over time in sequence, however, control logic 704 may include adder 808 to form control word 806.

In one embodiment, adder 808 may receive as input the output bits from delay blocks 802-1 through 802-m−1 via control lines 804-1-m. Adder 808 may also receive as input counter signal 810 from counter 732. In one embodiment, for example, adder 808 may operate as a modulo-adder. For example, the binary values received by adder 808 via control lines 804-1-m may be divided by the counter value received via counter signal 810 to provide a remainder in accordance with X (mod Y), where X represents the binary values and Y represents the counter value. Adder 808 may output the modulo remainder as code word 806 over m control lines to a corresponding multiplexer 806. The corresponding multiplexer 806 may use control word 806 to select which analog waveform passes through multiplexer 806 via one of the input lines from delay blocks 736-1-m. In this manner, counter 732 may operate as a timing indicator to control when the appropriate waveform from the multiple waveforms received by a multiplexer 706 is passed through multiplexer 706 at the proper bit-interval.

Some embodiments may include an alternative serial waveform architecture to the one described with reference to FIGS. 7 and 8. For example, another way of generating multiple waveforms using a serial generator is to generate the multiple waveforms in a time-multiplexed fashion (e.g., digitally via digital samples) using one waveform generator, and then time-demultiplex the aggregate waveform to separate the time-multiplexed waveforms.

Some embodiments may also use a combination of the parallel waveform architecture and the serial waveform architecture. For example, a reduced number of parallel waveform generators can be implemented, with each parallel wave-form generator to serially generate multiple waveforms that are distinctly accessed by the multiplexers via the appropriate delay lines.

Operations for the above embodiments may be further described with reference to the following figures and accompanying examples. Some of the figures may include a logic flow. Although such figures presented herein may include a particular logic flow, it can be appreciated that the logic flow merely provides an example of how the general functionality as described herein can be implemented. Further, the given logic flow does not necessarily have to be executed in the order presented unless otherwise indicated. In addition, the given logic flow may be implemented by a hardware element, a software element executed by a processor, or any combination thereof. The embodiments are not limited in this context.

Figure 9:
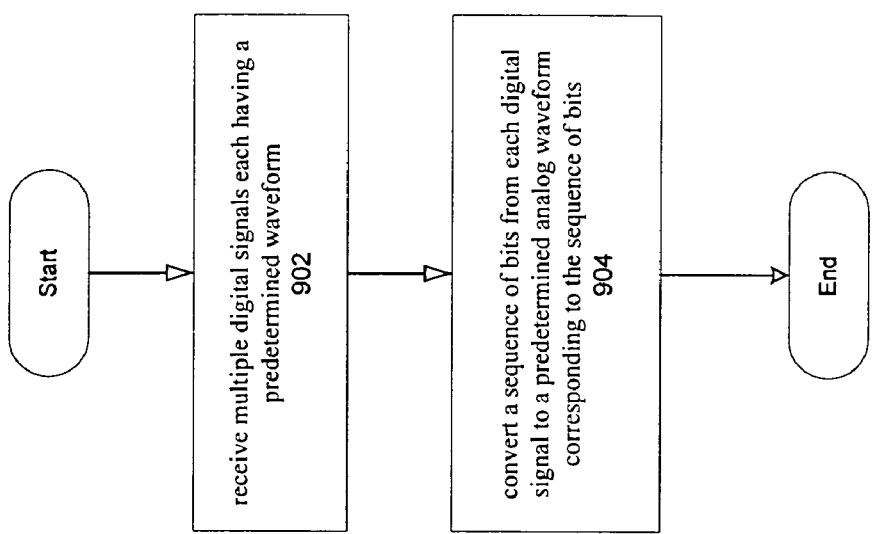
FIG. 9 illustrates an exemplary block flow diagram for a logic flow in accordance with one embodiment.

FIG. 9 illustrates an exemplary block flow diagram for a logic flow in accordance with one embodiment. FIG. 9 illustrates a logic flow 900. Logic flow 900 may be representative of the operations executed by one or more embodiments. As shown in logic flow 900, multiple digital signals each having a predetermined waveform may be received at block 902. A sequence of bits from each digital signal may be converted to a predetermined analog waveform corresponding to said sequence of bits at block 904. The embodiments are not limited in this context.

In one embodiment, for example, the predetermined analog waveform may represent a predetermined impulse response for a filter based on the periodic waveform. The embodiments are not limited in this context.

In one embodiment, a control word may be generated using a sequence of bits from the digital signal. Furthermore, different analog waveforms may be generated. In one embodiment, for example, the different analog waveforms may be received in parallel, the control word may be received, and the predetermined analog waveform may be selected from the different analog waveforms using the control word. In one embodiment, for example, the different analog waveforms may be received at different time intervals, the control word may be received, and the predetermined analog waveform may be selected from the different analog waveforms using the control word. The embodiments are not limited in this context.

In one embodiment, the predetermined analog waveform may be weighted. The weighted analog waveform may be summed with other weighted analog waveforms to form an analog output signal. The embodiments are not limited in this context.

Some embodiments may implement DAC 110 using hardware, software, or a combination of both. When implemented in software, for example, DAC 110 may be implemented using a processing system comprising a processor and memory. The processor may be implemented as any processor, such as a complex instruction set computer (CISC) microprocessor, a reduced instruction set computing (RISC) microprocessor, a very long instruction word (VLIW) microprocessor, a processor implementing a combination of instruction sets, a general-purpose processor, or other processor device. The processor may also be implemented as a dedicated processor, such as a controller, microcontroller, embedded processor, a digital signal processor (DSP), a network processor, a media processor, an input/output (I/O) processor, and so forth. The memory may include any machine-readable or computer-readable media capable of storing data, including both volatile and non-volatile memory. For example, the memory may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by any combination of programmed general-purpose computer components and custom hardware components.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments.

Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus, comprising:
a digital-to-analog converter having an impulse response emulator, said impulse response emulator to receive multiple digital signals each having a predetermined waveform, and convert a sequence of bits from each digital signal to a predetermined analog waveform corresponding to said sequence of bits, wherein said impulse response emulator to include a bit path for each digital signal, with each bit path to include a control logic and a multiplexer, said multiplexer to output said predetermined analog waveform using control information from said control logic.

2. The apparatus of claim 1, said predetermined analog waveform to represent a predetermined impulse response for a filter based on said predetermined waveform.

3. The apparatus of claim 1, said control logic to receive a sequence of bits from a corresponding digital signal, and output a control word using said sequence of bits.

4. The apparatus of claim 3, comprising multiple waveform generators to couple to said multiplexer, with each of said waveform generators to generate a different analog waveform.

5. The apparatus of claim 4, with said multiplexer to receive said different analog waveforms in parallel from said waveform generators, receive said control word from a corresponding control logic, said control word to select said predetermined analog waveform from said different analog waveforms, and output said predetermined analog waveform.

6. The apparatus of claim 3, comprising a waveform generator module having a waveform generator, a counter and multiple delay blocks, said waveform generator to generate a different analog waveform on a periodic basis, said delay blocks to receive each analog waveform and delay each received analog waveform by a varying amount of time prior to sending said received analog waveform to said multiplexer, said counter to couple to said control logic and output a count signal, and said control logic to use said count signal to generate said control word.

7. The apparatus of claim 6, with said multiplexer to receive said different analog waveforms from said waveform generator at different time intervals, receive said control word from a corresponding control logic to select said predetermined analog waveform from said different analog waveforms, and output said predetermined analog waveform.

8. The apparatus of claim 1, further comprising a weighted-sum module having a weighting element for each bit path and a summation element, said weighting element to weight said predetermined analog waveform and output a weighted analog waveform, and said summation element to sum said weighted analog waveform with other weighted analog waveforms to form an analog output signal.

9. The apparatus of claim 1, comprising at least one filter to filter said predetermined analog waveform.

10. A method, comprising:
receiving multiple digital signals each having a predetermined waveform;
converting a sequence of bits from each digital signal to a predetermined analog waveform corresponding to said sequence of bits; and
generating a control word using a sequence of bits from said digital signal.

11. The method of claim 10, said predetermined analog waveform to represent a predetermined impulse response for a filter based on said predetermined waveform.

12. The method of claim 10, comprising generating different analog waveforms.

13. The method of claim 12, comprising:
receiving said different analog waveforms in parallel;
receiving said control word; and
selecting said predetermined analog waveform from said different analog waveforms using said control word.

14. The method of claim 12, comprising:
receiving said different analog waveforms at different time intervals;
receiving said control word; and
selecting said predetermined analog waveform from said different analog waveforms using said control word.

15. A method, comprising:
receiving multiple digital signals each having a predetermined waveform;
converting a sequence of bits from each digital signal to a predetermined analog waveform corresponding to said sequence of bits;
weighting said predetermined analog waveform; and
summing said weighted analog waveform with other weighted analog waveforms to form an analog output signal.

16. An article comprising a machine-readable storage medium containing instructions that if executed enable a system to receive multiple digital signals each having a predetermined waveform, convert a sequence of bits from each digital signal to a predetermined analog waveform corresponding to said sequence of bits, receive different analog waveforms in parallel, receive a control word, and select said predetermined analog waveform from said different analog waveforms using said control word.

17. The article of claim 16, said predetermined analog waveform to represent a predetermined impulse response for a filter based on said predetermined waveform.

18. An article comprising a machine-readable storage medium containing instructions that if executed enable a system to receive multiple digital signals each having a predetermined waveform, convert a sequence of bits from each digital signal to a predetermined analog waveform corresponding to said sequence of bits, receive different analog waveforms at different time intervals, receive a control word, and select said predetermined analog waveform from said different analog waveforms using said control word.

19. An article comprising a machine-readable storage medium containing instructions that if executed enable a system to receive multiple digital signals each having a predetermined waveform, convert a sequence of bits from each digital signal to a predetermined analog waveform corresponding to said sequence of bits, weight said predetermined analog waveform, and sum said weighted analog waveform with other weighted analog waveforms to form an analog output signal.

* * * * *